US009753369B2

(12) United States Patent
Sakamoto et al.

(10) Patent No.: US 9,753,369 B2
(45) Date of Patent: Sep. 5, 2017

(54) POLYMER-CONTAINING DEVELOPER

(75) Inventors: Rikimaru Sakamoto, Toyama (JP);
Yasushi Sakaida, Toyama (JP);
Bangching Ho, Toyama (JP)

(73) Assignee: NISSAN CHEMICAL IDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/007,096

(22) PCT Filed: Mar. 19, 2012

(86) PCT No.: PCT/JP2012/057019
§ 371 (c)(1),
(2), (4) Date: Oct. 10, 2013

(87) PCT Pub. No.: WO2012/128251
PCT Pub. Date: Sep. 27, 2012

(65) Prior Publication Data
US 2014/0038415 A1 Feb. 6, 2014

(30) Foreign Application Priority Data
Mar. 24, 2011 (JP) .................................. 2011-066290

(51) Int. Cl.
G03C 5/29 (2006.01)
G03F 7/32 (2006.01)
H01L 21/027 (2006.01)
H01L 21/306 (2006.01)
H01L 21/033 (2006.01)
G03F 7/09 (2006.01)
G03F 7/11 (2006.01)
G03F 7/26 (2006.01)

(52) U.S. Cl.
CPC .............. *G03F 7/325* (2013.01); *G03F 7/094* (2013.01); *G03F 7/11* (2013.01); *G03F 7/26* (2013.01); *H01L 21/027* (2013.01); *H01L 21/0275* (2013.01); *H01L 21/0337* (2013.01); *H01L 21/306* (2013.01)

(58) Field of Classification Search
CPC ........... G03F 7/11; G03F 7/325; H01L 21/027
USPC .................................................. 430/331, 105
See application file for complete search history.

(56) References Cited

U.S. PATENT DOCUMENTS

| | | | |
|---|---|---|---|
| 4,308,340 A | 12/1981 | Walls | |
| 4,339,530 A | 7/1982 | Sprintschnik et al. | |
| 5,262,283 A * | 11/1993 | Sezi et al. | ..................... 430/325 |
| 6,331,373 B1 * | 12/2001 | Kuramoto | ............ G03G 9/0819 |
| | | | 430/108.2 |
| 6,511,792 B2 * | 1/2003 | Fujino et al. | ................. 430/311 |
| 6,770,423 B2 | 8/2004 | Rottstegge et al. | |
| 2007/0184387 A1 | 8/2007 | Inno | |
| 2010/0273110 A1* | 10/2010 | Ogihara | ............. H01L 21/0273 |
| | | | 430/324 |

FOREIGN PATENT DOCUMENTS

| | | |
|---|---|---|
| CA | 2048830 A1 | 2/1992 |
| CN | 1342920 A | 4/2002 |
| EP | 0 320 945 A2 | 6/1989 |
| EP | 1 650 605 A1 | 4/2006 |
| EP | 2 302 461 A1 | 3/2011 |
| EP | 2 360 529 A1 | 8/2011 |
| JP | A-10-104846 | 4/1998 |
| JP | A-2004-347983 | 12/2004 |
| JP | A-2005-115118 | 4/2005 |
| JP | A-2005-277052 | 10/2005 |
| JP | A-2006-011207 | 1/2006 |
| JP | A-2009-244778 | 10/2009 |

OTHER PUBLICATIONS

Apr. 17, 2012 Written Opinion issued to International Application No. PCT/JP2012/057019.
Extended Search Report issued in European Patent Application No. 12760565.7 dated Jul. 21, 2014.
Sep. 6, 2015 Office Action issued in Chinese Application No. 201280014835.1.

* cited by examiner

*Primary Examiner* — Daborah Chacko Davis
(74) *Attorney, Agent, or Firm* — Oliff PLC

(57) ABSTRACT

Disclosed is a developer, one that does not cause pattern collapse during the formation process, for the formation of a fine pattern and a method for pattern formation using the developer. A developer used in a lithography process includes a polymer for forming a dry-etching mask and an organic solvent. The polymer is preferably a curable resin different from a curable resin forming a resist film. The developer is preferably used after exposure of the resist film. The organic solvent in the developer is preferably butyl acetate or a mixed solvent of butyl acetate and an alcohol, or 2-pentanone or a mixed solvent of 2-pentanone and an alcohol. Also disclosed is a method for producing a semiconductor device.

14 Claims, No Drawings

POLYMER-CONTAINING DEVELOPER

TECHNICAL FIELD

The present invention relates to a developer used in a lithography process.

BACKGROUND ART

Conventional production of semiconductor devices has employed lithographic microfabrication using a photoresist composition. In the microfabrication, the photoresist composition is formed into a thin film on a silicon wafer; active light such as ultraviolet light is applied to the photoresist through a mask pattern with a pattern for a semiconductor device; the photoresist is developed; and the silicon wafer is etched using the obtained resist pattern as a protective film. In recent years, a semiconductor device has been further integrated and the wavelength of the active light to be used has been shortened from an i-line (wavelength 365 nm) and a KrF excimer laser (wavelength 248 nm) to an ArF excimer laser (wavelength 193 nm). Such a change raises serious issues of the influence of irregular reflections of active light from a substrate or standing waves. To address the issues, an anti-reflective coating (bottom anti-reflective coating) between the photoresist and the substrate has been widely studied.

Increasingly finer patterns cause pattern collapse in a lithography process. Such an issue arises in processes of development and rinsing a developer after exposure of a resist.

The pattern collapse is supposed to be caused by surface tension of a developer or a rinse solution during drying or a force applied between patterns by the force associated with liquid flow, namely, Laplace force. Furthermore, the Laplace force is supposed to cause pattern collapse also when the developer or the rinse solution is spun off to the outside by a centrifugal force.

In order to solve such a problem, a pattern forming method is disclosed. The method includes forming a resist film on a substrate, selectively irradiating the resist film with an energy beam in order to form a latent image in the resist film, supplying a developer (alkali developer) onto the resist film in order to form a resist pattern from the resist film having the latent image, supplying a rinse solution onto the substrate in order to replace the developer on the substrate with the rinse solution, supplying a coating film material onto the substrate in order to replace at least a part of the rinse solution on the substrate with the coating film material containing a solvent and a solute different from that in the resist film, volatilizing the solvent in the coating film material in order to form a coating film covering the resist film on the substrate, removing at least a part of a surface on the coating film in order to expose at least a part of a top surface of the resist pattern and to form a mask pattern including the coating film, and processing the substrate using the mask pattern (see Patent Document 1).

PRIOR ART DOCUMENTS

Patent Document

Patent Document 1: Japanese Patent Application Publication No. 2005-277052 (JP 2005-277052 A)

SUMMARY OF THE INVENTION

Problem to be Solved by the Invention

Finer resist patterns cause pattern collapse due to Laplace force also when a developer is spin-dried during development.

An object of the present invention is to provide a developer not causing pattern collapse during the formation of a fine pattern and a pattern formation method using the developer.

Means for Solving the Problem

The present invention provides: according to a first aspect, a developer used in a lithography process, the developer comprising: a polymer for forming a dry-etching mask; and an organic solvent;

according to a second aspect, the developer according to the first aspect, in which the polymer is a curable resin different from a curable resin forming a resist film;

according to a third aspect, the developer according to the first aspect or the second aspect, in which the developer is used after exposure of the resist film;

according to a fourth aspect, the developer according to any one of the first aspect to the third aspect, in which the organic solvent in the developer is butyl acetate or a mixed solvent of butyl acetate and an alcohol;

according to a fifth aspect, the developer according to any one of the first aspect to the third aspect, in which the organic solvent in the developer is 2-pentanone or a mixed solvent of 2-pentanone and an alcohol;

according to a sixth aspect, the developer according to any one of the first aspect to the fifth aspect, in which the polymer is a novolac resin or a polyorganosiloxane;

according to a seventh aspect, the developer according to any one of the first aspect to the sixth aspect, in which the concentration of the polymer in the developer is 0.5 to 20% by weight;

according to an eighth aspect, a method for producing a semiconductor device, the method comprising: (A) applying a resist to a semiconductor substrate to form a resist film and exposing the resist film; (B) bringing a surface of the resist film into contact with the developer as described in any one of the first aspect to the seventh aspect to form a layer of the polymer between patterns of the resist film thus patterned; and (C) removing the resist film thus patterned by dry etching to form a reverse pattern using the polymer;

according to a ninth aspect, the method for producing a semiconductor device according to the eighth aspect, in which the forming of the resist film in (A) is performed by forming a resist underlayer film on the semiconductor substrate and forming the resist film on the resist underlayer film;

according to a tenth aspect, the method for producing a semiconductor device according to the eighth aspect, in which the forming of the resist film in (A) is performed by forming an organic underlayer film on the semiconductor substrate, forming a hard mask containing a silicon atom on the organic underlayer film, and forming the resist film on the hard mask;

according to an eleventh aspect, the method for producing according to any one of the eighth aspect to the tenth aspect, in which the forming of the polymer layer in (B) includes applying heat; and according to a twelfth aspect, the method for producing according to any one of the eighth aspect to the eleventh aspect, in which, in (C), the dry etching rate ratio of resist/polymer is 1.0 or more.

Effects of the Invention

The invention includes applying a resist onto a semiconductor substrate to form a resist film, then exposing the resist film, and bringing a polymer-containing developer into contact with the resist film to thus form a pattern for the resist film and to fill the polymer in space in the pattern. This can suppress the resist collapse during development and rinse. Furthermore, in the present invention, the polymer is a curable resin different from a curable resin forming the resist film, which allows dry etching to selectively remove the resist film alone. Accordingly, the present invention can form a new fine pattern using the polymer.

MODES FOR CARRYING OUT THE INVENTION

The related art in Patent Document 1 is a method in which the surface of a resist after exposure is developed with a developer and is washed with a rinse solution, the rinse solution is replaced with a coating solution containing a polymer component, the resist pattern is thus covered with the polymer component, and then dry etching removes the resist to form a reverse pattern using the replaced polymer component.

However, the above method may cause pattern collapse due to Laplace force during the removing of the resist by a developer or a rinse solution to form the resist pattern.

In the present invention, the resist surface after exposure through a mask is brought into contact with a developer containing a polymer for forming a dry-etching mask. An exposed area of the resist is insoluble in an organic solvent, while an unexposed area of the resist is dissolved in the developer containing the organic solvent, and the space in the resist pattern is filled with the polymer contained. This suppresses the resist pattern collapse. Then, the surface with the filled resist pattern is subjected to dry etching to remove the resist pattern and thus the filled polymer becomes a new resist pattern. This may be considered as a reverse process.

The resist layer and the polymer to be filled preferably have different dry etching rates with respect to a gas used for dry etching. For example, for a resist layer including an acrylic resist material, a polymer in the polymer layer to be filled preferably employs a resin having a high carbon content, such as a novolac resin (a phenol novolac resin, a naphthol novolac resin, or a combination of them) and a polyorganosiloxane material.

In the present invention, by applying the polymer-containing developer to a resist after exposure, while an unexposed area is developed, the space in the resist pattern formed by developing and removing the resist is filled with the polymer capable of forming a new pattern in a later process. Thus, the filling can be performed without the collapse of the initial resist pattern, and the subsequent dry etching process can form a fine pattern as a reverse pattern without collapse.

The composition of the present invention will be described.

The present invention is a resist developer that includes a polymer for forming a dry-etching mask and an organic solvent and is used in a lithography process.

The developer includes an organic solvent dissolving the polymer for forming a dry-etching mask and has a solid content of 0.5 to 20.0% by mass or 1.0 to 10.0% by mass.

The solid content is the ratio of a residue in the developer after the organic solvent is removed.

In the solid content, the ratio of the polymer for forming a dry-etching mask is 50 to 100% by mass or 80 to 100% by mass.

The concentration of the polymer for forming a dry-etching mask in the developer is 0.5 to 20.0% by mass.

In the present invention, the developer is used after exposure of a resist and thus an area on which the resist is removed by the developer after the exposure through a mask is an unexposed area.

The polymer for forming a dry-etching mask is a curable resin different from the curable resin forming a resist film.

Accordingly, selecting a gas in a later dry etching process allows dry etching to selectively remove the resist and to form a new pattern of the filled polymer for forming a dry-etching mask.

Specifically, a solvent having no hydroxy group is preferably butyl acetate and can be exemplified by a mixed solvent of an alcohol and butyl acetate. Examples of such a solvent include a mixed organic solvent containing 4-methyl-2-pentanol and butyl acetate in a mass ratio of 1:99 to 20:80.

The solvent can be further exemplified by a mixed solvent of propylene glycol monomethyl ether and butyl acetate. Examples of such a solvent include a mixed organic solvent containing propylene glycol monomethyl ether and butyl acetate in a mass ratio of 1:99 to 20:80.

The polymer for forming a dry-etching mask included in the developer can be exemplified by a curable resin different from the curable resin included in a resist film. For example, when an acrylic resist is used, the polymer in a polymer layer to be filled is preferably a resin having a high carbon content, such as a novolac resin (a phenol novolac resin, a naphthol novolac resin, or a combination of them) and a polyorganosiloxane material.

The novolac resin is exemplified below.

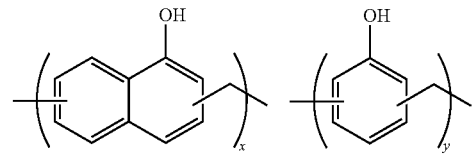

Formula (1)

Usable novolac resins include the unit structure above or a combination of the unit structures. x and y represent a molar ratio and x:y is 100:0 to 0:100, 80 to 20:20 to 80, or 70 to 30:30 to 70.

A polymer having the unit structure of Formula (1) may have a weight average molecular weight ranging from 1,000 to 30,000 or from 2,000 to 10,000.

The polysiloxane resin may be a polysiloxane obtained by hydrolysis and condensation of at least one hydrolyzable silane selected from the silanes exemplified by Formula (2).

$$R^1_a Si(R^2)_{4-a}$$ Formula (2)

In Formula, $R^1$ is an alkyl group, an aryl group, an aralkyl group, a halogenated alkyl group, a halogenated aryl group, a halogenated aralkyl group, an alkenyl group, an epoxy group, an acryloyl group, a methacryloyl group, a mercapto group, an alkoxyaryl group, an acyloxyaryl group, an organic group having a cyano group, or a combination of them and is bonded to the silicon atom through a Si—C bond; $R^2$ is an alkoxy group, an acyloxy group, or a halogen group; and a is an integer of 0 to 3.

The polysiloxane obtained by hydrolysis and condensation of at least one hydrolyzable silane selected from of Formula (2) has a weight-average molecular weight ranging from 500 to 30,000 or from 800 to 10,000.

For the hydrolysis of an alkoxy silyl group, an acyloxy silyl group, or a halogenated silyl group, 0.5 to 100 mol, preferably 1 to 10 mol of water is used based on 1 mol of hydrolyzable group. on 1 mol of hydrolyzable group.

The reaction temperature for the hydrolysis and condensation is typically 20 to 80° C.

The hydrolysis may be complete hydrolysis or partial hydrolysis. In other words, a hydrolysis and condensation product may contain hydrolysates and monomers. A catalyst may be used for the hydrolysis and condensation.

Examples of the hydrolysis catalyst include a metal chelate compound, an organic acid, an inorganic acid, an organic base, and an inorganic base.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, metal chelate compounds, organic acids, and inorganic acids are preferred and these may be used singly or in combination of two or more of them.

Examples of the organic solvent used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonylalcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents such as ethylene glycol, propylene glycol, 1,3-butylene glycol, pentanediol-2,4, 2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, 4-methyl-2-pentanol, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propane sultone. These solvents may be used singly or in combination of two or more of them.

The polysiloxane is exemplified below.

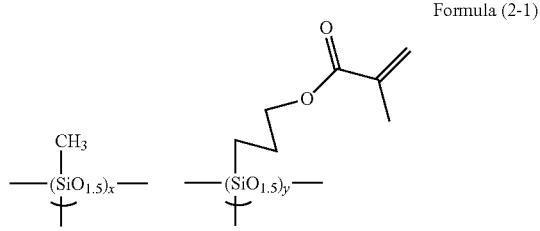

Formula (2-1)

x and y represent a molar ratio and x:y is 100:0 to 0:100, 80 to 20:20 to 80, or 70 to 30:30 to 70.

The present invention is a method for producing a semiconductor device. The method includes (A) applying a resist to a semiconductor substrate to form a resist layer and exposing the resist layer, (B) bringing a surface of the resist layer into contact with the developer as described in any one of the first aspect to the seventh aspect and forming a layer of the polymer between the resist patterns, and (C) removing the resist layer by dry etching and forming a reverse pattern using the polymer.

Examples of the resist material used in (A) include a resist containing a resin component such as polymethacrylate. A resist solution is applied and then burned at a burning temperature of 70.0 to 150.0° C. for a burning time of 0.5 to 5 minutes. Subsequently a resist is obtained having a film thickness ranging from 10 to 1,000 nm. The resist solution, the developer, and coating materials described below may be applied by spin coating, dipping, spraying, or other means and spin coating is especially preferred. The resist is exposed through a predetermined mask. The exposure may employ a KrF excimer laser (a wavelength of 248 nm), an ArF excimer laser (a wavelength of 193 nm), EUV rays (a wavelength of 13.5 nm), and an electron beam, for example. After the exposure, post exposure bake (PEB) may be performed as necessary. The post exposure bake is performed in a condition appropriately selected from a heating temperature of 70° C. to 150° C. and a heating time of 0.3 to 10 minutes.

In the resist formation in (A), a resist underlayer film may be formed on

In the resist formation in (A), an organic underlayer film may be formed on the semiconductor substrate, then a silicon hard mask may be formed on the organic underlayer film, and the resist may be formed on the silicon hard mask.

The resist underlayer film used in (A) suppresses irregular reflections during the exposure of an upper layer resist and is also used in order to improve the adhesion to the resist. The resist underlayer film may employ an acrylic resin or a novolac resin, for example. The resist underlayer film may be a film formed on the semiconductor substrate and having a film thickness of 1 to 1,000 nm.

The organic underlayer film used in (A) is a hard mask with an organic resin and employs a material having a high carbon content and a low hydrogen content. Examples include a polyvinylnaphthalene resin, a carbazole novolac resin, a phenol novolac resin, and a naphthol novolac resin. Such a material may be formed into a film having a film thickness of 5 to 1,000 nm on the semiconductor substrate.

Regarding the silicon hard mask used in (A), the polysiloxane resin may be a polysiloxane obtained by hydrolysis of at least one hydrolyzable silane selected from the silanes exemplified by Formula (2). Examples include polysiloxanes obtained by hydrolysis of tetraethoxysilane, methyltrimethoxysilane, and phenyltriethoxysilane. Such a material may be formed into a film having a film thickness of 5 to 200 nm on the organic underlayer film.

In (B), the polymer for forming the polymer layer for forming a dry-etching mask may be formed by heating. The heating is performed at a burning temperature of 50 to 180° C. and for 0.5 to 5 minutes.

In (C), the dry etching is performed using a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, and chlorine trifluoride. The dry etching removes the initial resist pattern to form a reverse pattern composed of the polymer for forming a dry-etching mask included in the developer.

EXAMPLES

Synthesis Example 1

In 3.88 g of propylene glycol monomethyl ether and 93.12 g of butyl acetate, 3 g of naphthol novolac resin (the novolac resin had been synthesized by reaction of a mixture of 1-naphthol and phenol in a molar ratio of 50:50 with formaldehyde; a weight-average molecular weight of 3,200) was dissolved to yield a developer containing the polymer for forming a dry-etching mask.

Synthesis Example 2

In 3.88 g of 4-methyl-2-pentanol and 93.12 g of butyl acetate, 3 g of silicon-containing resin (the polysiloxane resin had been synthesized by hydrolysis and condensation of a mixed silane of 3-trimethoxysilylpropyl methacrylate and methyltriethoxysilane in a molar ratio of 20:80; a weight-average molecular weight of 26,000) was dissolved to yield a developer containing the polymer for forming a dry-etching mask.

(Replacement of Resist Unexposed Area and Patterning by Dry Etching)

Example 1

Onto a silicon substrate, a resist underlayer film (a commercial product containing polymethacrylate as a resin component) was applied using a spinner to form a film having a film thickness of 80 nm. Onto the film, a resist solution for ArF (a commercial product containing polymethacrylate as a resin component) was applied using a spinner.

The substrate was heated on a hot plate at 100° C. for 60 seconds to yield a resist film having a film thickness of 100 nm. With an exposure apparatus for an ArF excimer laser (manufactured by NIKON, S307E), the resist film was exposed in a predetermined condition. The intended line width was 65 nm line-and-space. After the exposure, the substrate was heated at 105° C. for 60 seconds (PEB) and then was cooled on a cooling plate to room temperature. The developer obtained in Synthesis Example 1 was applied onto the resist film as a liquid, then left for 60 seconds, and spun at 1,500 rpm for 60 seconds to spin-dry the solvent. The developer of Synthesis Example 1 was further applied as a liquid, then left for 5 seconds, and spun at 1,500 rpm for 60 seconds, thereby replacing the resist unexposed area with the pattern forming film.

The replacement of the resist unexposed area was determined by cross-sectional SEM observation.

Example 2

The procedure was carried out in a similar manner to that in Example 1 except that the developer of Synthesis Example 2 was used in place of the developer of Synthesis Example 1.

Comparative Example 1

The procedure was carried out in a similar manner to that in Example 1 except that a developer containing organic solvents alone was spin-coated and then the developer of Example 1 was used.

In Table 1, the embeddability of a polymer by the developer containing the polymer for forming a dry-etching mask was observed under cross-sectional SEM. A substrate with a good pattern was evaluated as "good" and a substrate with a poor pattern or no pattern was evaluated as "poor."

The pattern collapse was observed under cross-sectional SEM. A substrate with no pattern collapse was evaluated as "not collapsed" and a substrate with pattern collapse was evaluated as "collapsed."

TABLE 1

|  | Pattern embeddability | Pattern collapse |
| --- | --- | --- |
| Example 1 | Good | Not collapsed |
| Example 2 | Good | Not collapsed |
| Comparative Example 1 | Poor | Collapsed |

The film embedded in Example 2 was subjected to dry etching for patterning. $CF_4$ was used as the etching gas for the dry etching and the upper part of the resist pattern was exposed. Finally, $O_2$ was used as the etching gas for the dry etching to remove the resist, thereby obtaining a pattern. At least some of the resist underlayer film was etched together with the resist pattern.

INDUSTRIAL APPLICABILITY

A fine resist pattern can be formed without pattern collapse and can be used for the production of highly integrated semiconductor devices.

The invention claimed is:
1. A developer used in a lithography process, the developer comprising:
a polymer for forming a dry-etching mask; and
an organic solvent,
wherein
the developer is for forming a reverse pattern in the lithography process; and
the polymer is a novolac resin, or a polyorganosiloxane obtained by hydrolysis and condensation of at least one hydrolyzable silane selected from silanes having a structure of Formula (1):

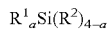  Formula (1)

where:
R¹ is selected from the group consisting of an alkyl group, an aryl group, an aralkyl group, a halogenated alkyl group, a halogenated aryl group, a halogenated aralkyl group, an alkenyl group, an epoxy group, an acryloyl group, a methacryloyl group, a mercapto group, an alkoxyaryl group, an acyloxyaryl group, an organic group having a cyano group, and a combination thereof;
R¹ is bonded to the silicon atom through a Si—C bond;
R² is selected from the group consisting of an alkoxy group, an acyloxy group, and a halogen group; and
a is an integer in a range of from 0 to 3.

2. The developer according to claim 1, wherein the polymer is a curable resin different from a curable resin forming a resist film.

3. The developer according to claim 1, wherein the developer is used after exposure of a resist film.

4. The developer according to claim 1, wherein the organic solvent in the developer is butyl acetate or a mixed solvent of butyl acetate and an alcohol.

5. The developer according to claim 1, wherein the organic solvent in the developer is 2-pentanone or a mixed solvent of 2-pentanone and an alcohol.

6. The developer according to claim 1, wherein the polymer is present in the developer in a concentration of from 0.5 to 20% by weight.

7. The developer according to claim 1, wherein:
a solid content of the developer is present in an amount in a range of from 0.5 to 20.0% by mass;
an amount of the polymer in the solid content is 50 to 100% by mass; and
the polysiloxane has a weight-average molecular weight in a range of from 500 to 30,000.

8. A method for producing a semiconductor device, the method comprising:
(A) applying a resist to a semiconductor substrate to form a resist film and exposing the resist film to light through a predetermined mask, thereby forming an exposed area and an unexposed area of the resist film;
(B) bringing a surface of the resist film into contact with the developer claimed in claim 1 to create a resist pattern by dissolving the unexposed area of the resist film in the organic solvent of the developer, and to form a layer of the polymer of the developer in a space created by the resist pattern; and
(C) removing the resist pattern by dry etching to form a reverse pattern comprising the polymer of the developer.

9. The method for producing a semiconductor device according to claim 8, wherein the forming of the resist film in (A) is performed by forming a resist underlayer film on the semiconductor substrate and forming the resist film on the resist underlayer film.

10. The method for producing a semiconductor device according to claim 8, wherein the forming of the resist film in (A) is performed by forming an organic underlayer film on the semiconductor substrate, forming a hard mask containing a silicon atom on the organic underlayer film, and forming the resist film on the hard mask.

11. The method for producing a semiconductor device according to claim 8, wherein the forming of the polymer layer in (B) includes applying heat.

12. The method for producing a semiconductor device according to claim 8, wherein, in (C), a dry etching rate ratio of resist/polymer is 1.0 or more.

13. A method for producing a semiconductor device, the method comprising:
contacting a surface of a resist film formed on a semiconductor substrate with a developer comprising a polymer and an organic solvent to create a resist pattern and to form a layer of the polymer of the developer in a space created by the resist pattern; and removing the resist pattern by dry etching to form a reverse pattern comprising the polymer of the developer;

wherein:

the resist film has been exposed to light through a predetermined mask to form an exposed area and an unexposed area; and the resist pattern is created by dissolving the unexposed area of the resist film in the organic solvent of the developer.

14. The method according to claim 13, further comprising applying a resist to the semiconductor substrate to form the resist film, and exposing the resist film to light through a predetermined mask to form the exposed area and the unexposed area of the resist film.

* * * * *